United States Patent
Mo et al.

(10) Patent No.: US 7,154,327 B2
(45) Date of Patent: Dec. 26, 2006

(54) SELF-TIMED MULTIPLE BLANKING FOR NOISE SUPPRESSION DURING FLAG GENERATION IN A MULTI-QUEUE FIRST-IN FIRST-OUT MEMORY SYSTEM

(75) Inventors: Jason Z. Mo, Fremont, CA (US); Mario Au, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/040,927

(22) Filed: Jan. 21, 2005

(65) Prior Publication Data
US 2006/0017497 A1  Jan. 26, 2006

Related U.S. Application Data

(60) Provisional application No. 60/591,499, filed on Jul. 26, 2004, provisional application No. 60/600,347, filed on Aug. 9, 2004.

(51) Int. Cl.
*H03K 5/00* (2006.01)
(52) U.S. Cl. ......................... 327/551; 327/34
(58) Field of Classification Search ................... 327/34, 327/551–552, 261
See application file for complete search history.

(56) References Cited

U.S. PATENT DOCUMENTS

| | | | | |
|---|---|---|---|---|
| 5,084,891 A | * | 1/1992 | Ariyavisitakul et al. | ..... 714/775 |
| 5,506,809 A | * | 4/1996 | Csoppenszky et al. | ....... 365/221 |
| 5,508,679 A | * | 4/1996 | McClure | .................. 340/146.2 |
| 6,678,759 B1 | * | 1/2004 | Stockton et al. | ............... 710/52 |
| 2006/0017497 A1 | | 1/2006 | Mo et al. | |
| 2006/0020743 A1 | | 1/2006 | Au et al. | |

* cited by examiner

*Primary Examiner*—Dinh T. Le
(74) *Attorney, Agent, or Firm*—Bever, Hoffman & Harms

(57) ABSTRACT

A write counter provides a write count value synchronized with a write clock signal. A read counter provides a read count value synchronized with a read clock signal. The read and write count values are routed through logic, which introduces noise to these values. A first delay circuit generates a first blanking signal, which has a duration corresponding with the duration of the noise introduced to the write count value, in response to the write clock signal. A second delay circuit generates a second blanking signal, which has a duration corresponding with the duration of the noise introduced to the read count value, in response to the second clock signal. The read and write count values are latched into read and write blanking registers, respectively, in response to the first and second blanking signals, respectively, effectively filtering the introduced noise prior to a subsequently performed comparison operation.

17 Claims, 4 Drawing Sheets

SELF-TIMED MULTIPLE BLANKING FOR NOISE SUPPRESSION DURING FLAG GENERATION IN A MULTI-QUEUE FIRST-IN FIRST-OUT MEMORY SYSTEM

RELATED APPLICATIONS

The present application is related to, and incorporates by reference, U.S. Provisional Patent Application Ser. No. 60/591,499 filed by Mario Au, Jason Z. Mo, Xiaoping Fang, Hui Su, Cheng-Han Wu, Ta-Chung Ma and Lan Lin on Jul. 26, 2004. The present application is also related to, and incorporates by reference, U.S. Provisional Patent Application Ser. No. 60/600,347 filed by Mario Au, Jason Z. Mo, Xiaoping Fang, Hui Su, Cheng-Han Wu, Ta-Chung Ma and Lan Lin on Aug. 9, 2004.

The present application is also related to, and incorporates by reference, the following commonly owned, co-filed U.S. patent applications.

U.S. patent application Ser. No. 11/040,892 entitled "Multiple Counters to Relieve Flag Restriction in a Multi-Queue First-Tn First-Out Memory System" by Mario Au and Jason Z. Mo.

U.S. patent application Ser. No. 11/040,895 entitled "Interleaving Memory Blocks to Relieve Timing Bottleneck in a Multi-Queue First-Tn First-Out Memory System" by Mario Au, Jason Z. Mo, Ta-Chung Ma and Lan Lin.

U.S. patent application Ser. No. 11/040,637 entitled "Mark/Re-Read and Mark/Re-Write Operations in a Multi-Queue First-In First-Out Memory System" by Mario Au and Jason Z. Mo.

U.S. patent application Ser. No. 11/040,896 entitled "Partial Packet Read/Write and Data Filtering in a Multi-Queue First-In First-Out Memory System" by Mario Au, Jason Z. Mo and Hui Su.

U.S. patent application Ser. No. 11/040,804 entitled "Synchronization of Active Flag and Status Bus Flags in a Multi-Queue First-In First-Out Memory System" by Mario Au, Jason Z. Mo and Cheng-Han Wu.

U.S. patent application Ser. No. 11/040,893 entitled "Status Bus Accessing Only Available Quadrants During Loop Mode Operation in a Multi-Queue First-In First-Out Memory System" by Mario Au, Jason Z. Mo and Cheng-Han Wu.

U.S. patent application Ser. No. 11/040,926 entitled "Multi-Queue Address Generator for Start and End Addresses in a Multi-Queue First-In First-Out Memory System" by Mario Au, Jason Z. Mo and Xiaoping Fang.

FIELD OF THE INVENTION

The present invention relates to flag generation in a multi-queue first in, first out (FIFO) memory.

PRIOR ART

A multi-queue FIFO memory device can be configured to implement a plurality of discrete FIFO queues. All queues within the device have a common data input bus (write port), and a common data output bus (read port). Data write and read operations are totally independent of each other. Thus, a queue may be selected on the write port, and a different queue may be selected on the read port. Alternately, read and write operations may be selected on the same queue simultaneously. Write operations are performed in a write clock domain, and read operations are performed in a read clock domain, wherein the read and write clock domains are asynchronous.

The multi-queue FIFO memory system must generate various control flags, such as a full flag (FF#) and an empty flag (EF#), thereby identifying the status of the queues selected for write and read operations, respectively. To generate these control flags, a read count value from the read clock domain must be compared with a write count value from the write clock domain.

Within a conventional multi-queue FIFO memory system, the read and write count values are provided to comparators. In response, the comparators provide results that are used to generate the various control flags (e.g., the full flag and the empty flag). However, transitions in the read and write count values typically exhibit a substantial amount of signal noise. To minimize the impact of this noise, blanking is typically performed at the output of the comparators.

FIG. 1A is a block diagram of a conventional flag generation circuit 100. Flag generation circuit 100 includes write counter 101, read counter 102, logic circuits 103–104, comparator 105, blanking latch 110 and delay elements 120–121. Write counter 101 is clocked by the write clock signal WCLK and read counter 102 is clocked by the read clock signal RCLK. The write count value WCNT is routed through logic circuit 103 to comparator 105, and the read count value RCNT is routed through logic circuit 104 to comparator 105. Write counter 101 and logic circuit 103 introduce noise 113 to the write count value WCNT. Similarly, read counter 102 and logic circuit 104 introduce noise 114 to the read count value RCNT.

Comparator 105 provides a flag signal (FLAG) in response to the write count value WCNT and the read count value RCNT. Comparator 105 introduces noise 115 to the resulting FLAG signal. The noise 115 introduced by comparator 105 is effectively added to the noise 113–114 introduced by counters 101–102 and logic circuits 103–104, thereby resulting in signal noise 116 in the FLAG signal.

Blanking is performed by storing the FLAG signal provided by comparator 105 in blanking latch 110, wherein the input of blanking latch 110 is disabled while signal noise 116 is present. Blanking latch 110 is disabled in response to a write blanking signal WBLANK and a read blanking signal RBLANK. The WBLANK signal is derived by routing the write clock signal WCLK through delay circuit 120. Delay circuit 120 introduces a delay D1, which is selected to correspond to the delays introduced by write counter 101, logic circuit 103 and comparator 105. Similarly, the RBLANK signal is derived by routing the read clock signal RCLK through delay circuit 121. Delay circuit 121 introduces a delay D2, which is selected to correspond with the delays introduced by read counter 102, logic circuit 104 and comparator 105.

FIG. 1B is a waveform diagram illustrating the operation of flag generation circuit 100. Note that the write clock signal WCLK is asynchronous with respect to the read clock signal RCLK. The WBLANK and RBLANK signals are activated high with delays D1 and D2, after rising edges of the WCLK and RCLK signals, respectively. Blanking latch 110 is only enabled when both the WBLANK and RBLANK signals are deactivated low. That is, blanking latch 110 is only enabled during the relatively short times represented by pulses U1–U4. Under these conditions, the FLAG signal provided by comparator 105 may not be reliably stored in blanking latch 110. Under worst case conditions, the overall blanking signal width, which includes both the WBLANK and RBLANK signals, can be wider than the period of the WCLK and RCLK signals. The resulting overall blanking signal might not allow the output of comparator 105 to be stored, as blanking latch 110 may always be disabled. This may create an erroneous state in the multi-queue FIFO memory (e.g., an erroneous flag output). This problem is exacerbated by the increased functionality and logic in today's more sophisticated multi-queue FIFO devices, which have increased noise sources.

It would therefore be desirable to have an improved method and apparatus for performing blanking for noise suppression in a multi-queue FIFO device.

SUMMARY

Accordingly, the present invention provides an improved method and structure for generating the various control flags, which substantially eliminates the signal noise introduced by the asynchronous read and write clock domains.

In accordance with one embodiment, a write counter is configured to provide a write count value that is synchronized with a write clock signal. The write clock signal is transmitted through write count routing logic (e.g., multiplexers) to a write blanking register. The write count routing logic introduces noise to the write count value. In addition, a read counter is configured to provide a read count value that is synchronized with a read clock signal. The read clock signal is transmitted through read count routing logic (e.g., multiplexers) to a read blanking register. The read count routing logic introduces noise to the read count value. The read and write clock signals are asynchronous.

A first delay circuit is configured to generate a self-timed first blanking signal in response to the write clock signal, wherein the first blanking signal has a duration corresponding with the duration of the noise introduced by the write count routing logic. The duration of the first blanking signal is therefore significantly shorter than the duration of a conventional blanking signal. A second delay circuit is configured to generate a self-timed second blanking signal in response to the read clock signal, wherein the second blanking signal has a duration corresponding with the duration of the noise introduced by the read count routing logic. The duration of the second blanking signal is therefore significantly shorter than the duration of a conventional blanking signal.

A first blanking register is configured to store the write count value in response to the first blanking signal, such that the noise introduced by the write count routing logic is not present when the write count value is stored. Similarly, a second blanking register is configured to store the read count value in response to the second blanking signal, such that the noise introduced by the read count routing logic is not present when the read count value is stored.

A comparator is coupled to receive the read and write count values stored in the first and second blanking registers. In response, the comparator generates a flag signal, which does not include the noise introduced by the write and read count routing logic.

In accordance with another embodiment, a third delay circuit is configured to generate a self-timed third blanking signal in response to the first blanking signal, wherein the duration of the third blanking signal is selected to correspond with the duration of noise introduced by the comparator. The duration of the third blanking signal is therefore significantly shorter than the duration of a conventional blanking signal. A fourth delay circuit is configured to generate a self-timed fourth blanking signal in response to the second blanking signal, wherein the duration of the fourth blanking signal is selected to correspond with the duration of noise introduced by the comparator. The duration of the fourth blanking signal is therefore significantly shorter than the duration of a conventional blanking signal. An output blanking latch is configured to store the flag signal provided by the comparator in response to the third and fourth blanking signals, such that the noise introduced by the comparator is not present when the flag signal is stored in the output blanking latch.

Because the durations of the third and fourth blanking signals are significantly shorter than the duration of conventional read and write blanking signals, the output blanking latch enable time is larger, such that the flag signal can be reliably stored in the output blanking latch.

The present invention will be more fully understood in view of the following description and drawings.

DETAILED DESCRIPTION

As described in more detail below, the present invention provides an improved method and structure for generating the various control flags, substantially eliminating the signal noise introduced by the asynchronous read and write clock domains of a multi-queue FIFO memory system.

In accordance with one embodiment of the present invention, multiple self-timed blanking signals and blanking registers are used on one or more inputs to a comparator used to generate a flag signal, thereby discretely blanking out noise from multiple sources (i.e., the read and write clock domains). The blanking registers on the comparator inputs compensate for functional logic circuitry present in the multi-queue flow control device. In one embodiment, a self-timed blanking signal and blanking latch may also be used on the output of the comparator. In other embodiments, the comparator can be replaced by any logic function or circuit requiring stable signals without noise. One such source of noise is multiple independent clock domains (e.g., the read and write clock domains in the multi-queue FIFO memory).

Figure 1A:
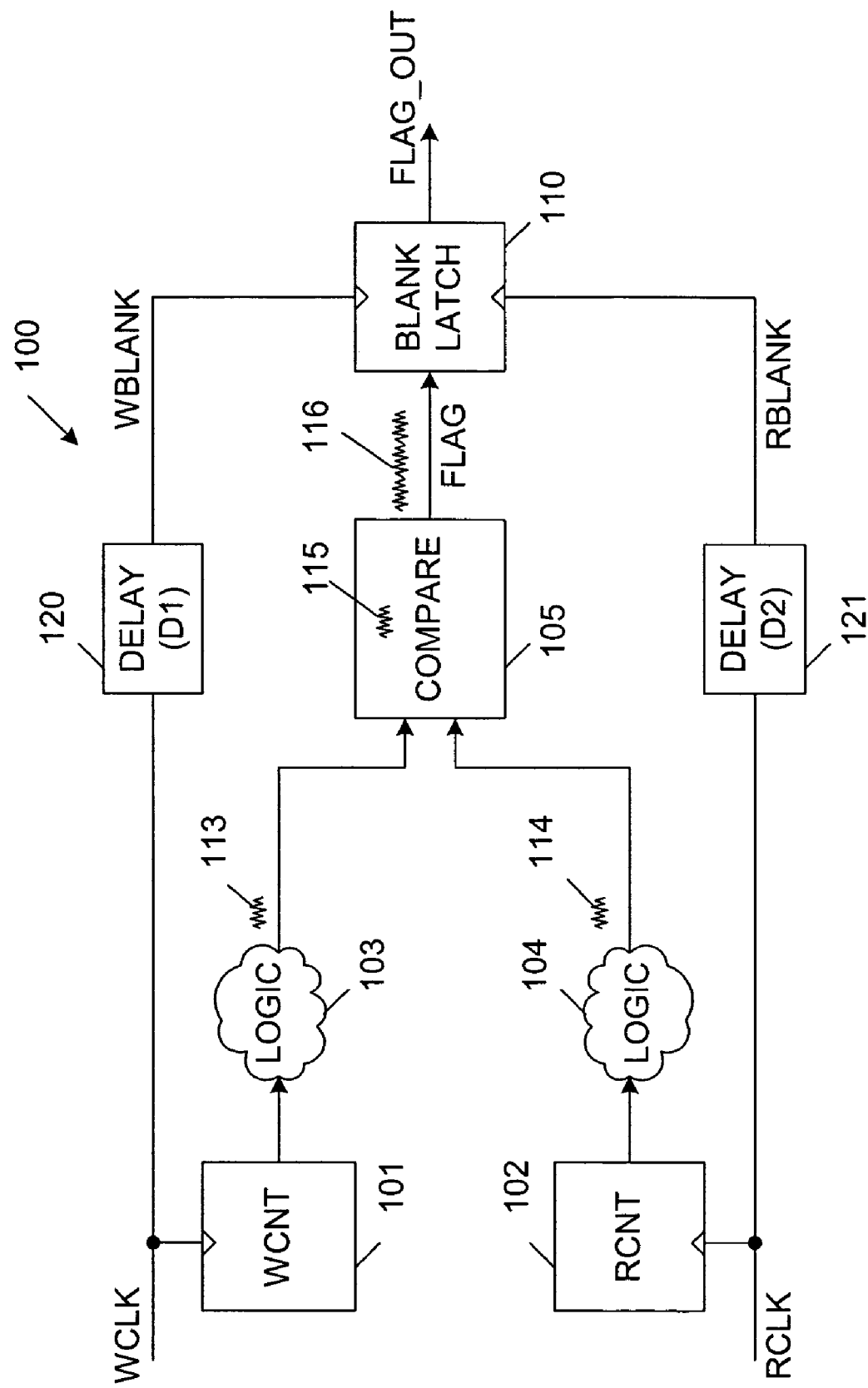
FIG. 1A is a block diagram of a conventional flag generation circuit in a multi-queue FIFO memory system.
Figure 2:
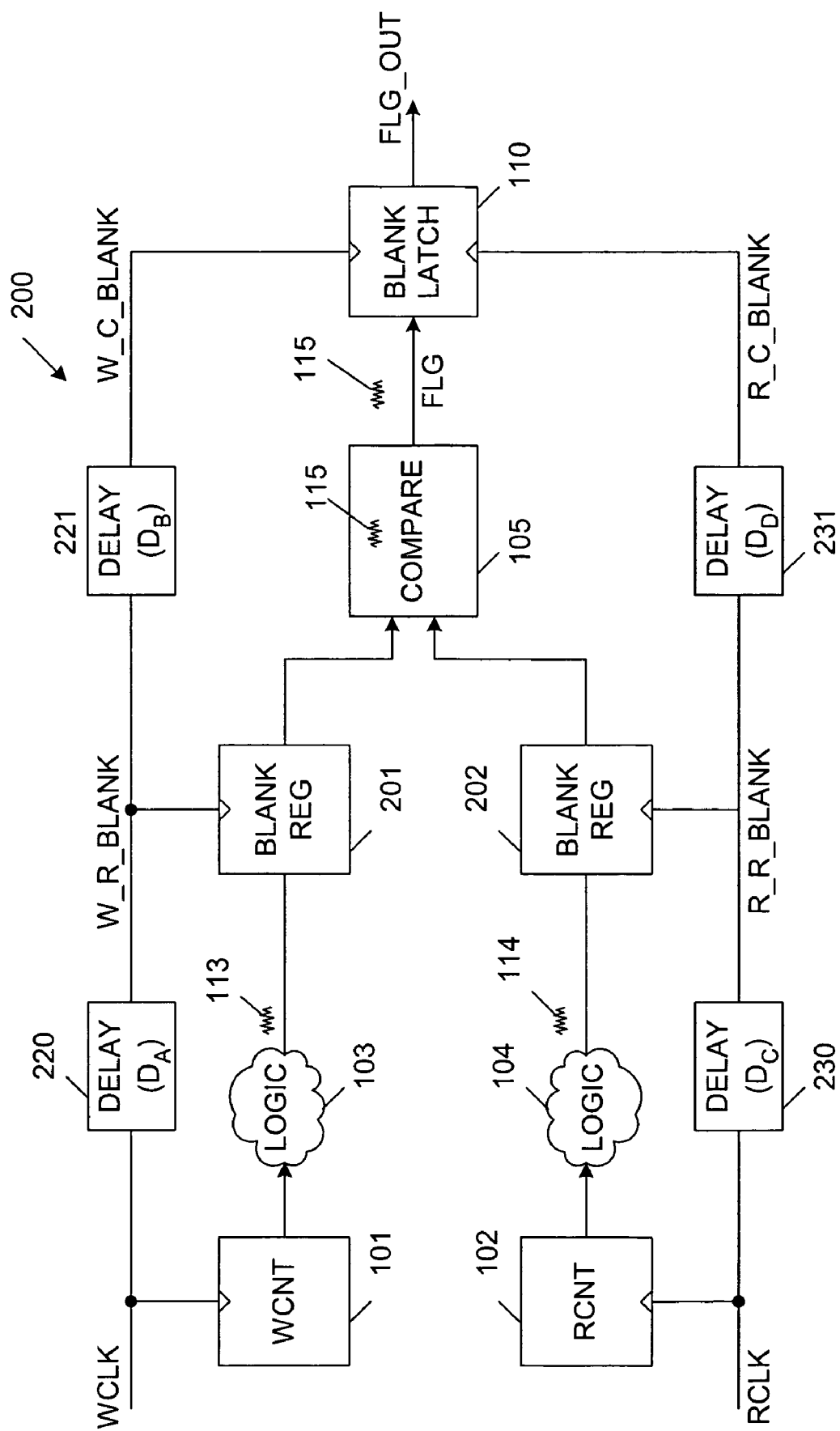
FIG. 2 is a block diagram of a flag generation circuit in accordance with one embodiment of the present invention.

FIG. 2 is a block diagram of a flag generation circuit 200 in accordance with one embodiment of the present invention. Because flag generation circuit 200 (FIG. 2) is similar to flag generation circuit 100 (FIG. 1A), similar elements in FIGS. 2 and 1A are labeled with similar reference numbers. Thus, flag generation circuit 200 includes write counter 101, read counter 102, logic circuits 103–104, comparator 105 and blanking latch 110, which have been described above in connection with FIG. 1A. In addition, flag generation circuit 200 includes blanking register 201, which is located between logic circuit 103 and a first input of comparator 105, and blanking register 202, which is located between logic circuit 104 and a second input of comparator 105. Flag generation circuit 200 also replaces delay circuit 120 with delay circuits 220–221, and replaces delay circuit 121 with delay circuits 230–231.

Delay circuit 220 introduces a delay $D_A$ to the write clock signal WCLK, thereby providing a self-timed write logic blanking signal W_R_BLANK, which is applied to blanking register 201. Delay circuit 221 introduces a delay DB to the W_R_BLANK signal, thereby providing a self-timed write comparator blanking signal W_C_BLANK, which is applied to blanking latch 110.

Similarly, delay circuit 230 introduces a delay $D_C$ to the read clock signal RCLK, thereby providing a self-timed read logic blanking signal R_R_BLANK, which is applied to blanking register 202. Delay circuit 231 introduces a delay $D_D$ to the R_R_BLANK signal, thereby providing a self-timed read comparator blanking signal R_C_BLANK, which is applied to blanking latch 110.

Figure 3:
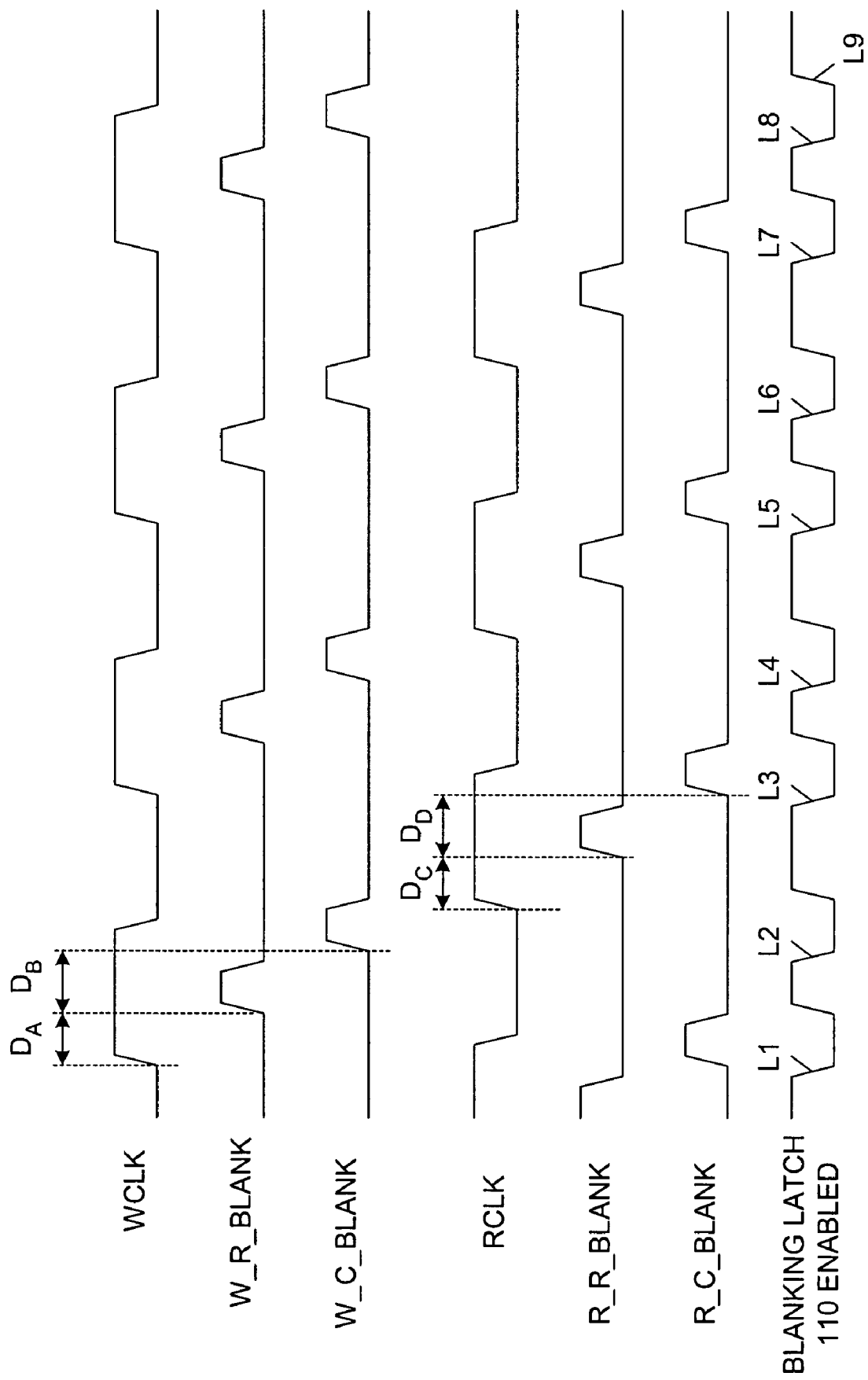
FIG. 3 is a waveform diagram illustrating the operation of the flag generation circuit of FIG. 2 in accordance with one embodiment of the present invention.

FIG. 3 is a waveform diagram illustrating the operation of flag generation circuit 200 in accordance with one embodiment of the present invention. Again, the write clock signal WCLK is asynchronous with respect to the read clock signal RCLK. After a delay of $D_A$ with respect to the rising edge of the WCLK signal, the W_R_BLANK signal is activated. The delay $D_A$ is selected to correspond with the signal delay through write counter 101 and logic circuit 103. Thus, the W_R_BLANK signal is activated when the noise 113 associated with write counter 101 and logic circuit 103 propagates to blanking register 201. Because blanking register 201 only has to blank the relatively small noise 113 associated with write counter 101 and logic circuit 103, the W_R_BLANK signal only has to be activated for a relatively short duration in order to eliminate the noise 113 from the write count signal WCNT. Delay circuit 220 is therefore controlled to generate a W_R_BLANK signal having a relatively short duration with respect to the period of the write clock signal WCLK. In one embodiment, the W_R_BLANK signal has a duration of about 28% percent (or less) of the period of the write clock signal WCLK. Note that 28% is only a number for a particular design. The W_R_BLANK pulse is generated by a delay circuit, which is independent of clock frequency. The W_R_BLANK pulse just needs to be wide enough to cover all noise. When the W_R_BLANK signal transitions to a logic low value, the write count signal WCNT is stored in blanking register 201, effectively eliminating noise 113.

Delay circuit 230 and blanking register 202 operate in a similar manner, with the R_R_BLANK signal being activated with a delay of $D_C$ with respect to the rising edge of the read clock signal RCLK. The delay $D_C$ is selected to correspond with the delay introduced by read counter 102 and logic circuit 104. Thus, the R_R_BLANK signal is activated when the noise 114 associated with read counter 102 and logic circuit 104 propagates to blanking register 202. Because blanking register 202 only has to blank the relatively small noise 114 associated with read counter 102 and logic circuit 104, the R_R_BLANK signal only has to be activated for a relatively short duration in order to eliminate the noise 114 from the read count signal RCNT. Delay circuit 230 is therefore controlled to generate a R_R_BLANK signal having a relatively short duration with respect to the period of the read clock signal RCLK. In one embodiment, the R_R_BLANK signal has a duration of about 28% percent (or less) of the period of the read clock signal RCLK. When the R_R_BLANK signal transitions to a logic low value, the read count signal RCNT is stored in blanking register 202, effectively eliminating noise 114.

Figure 1B:
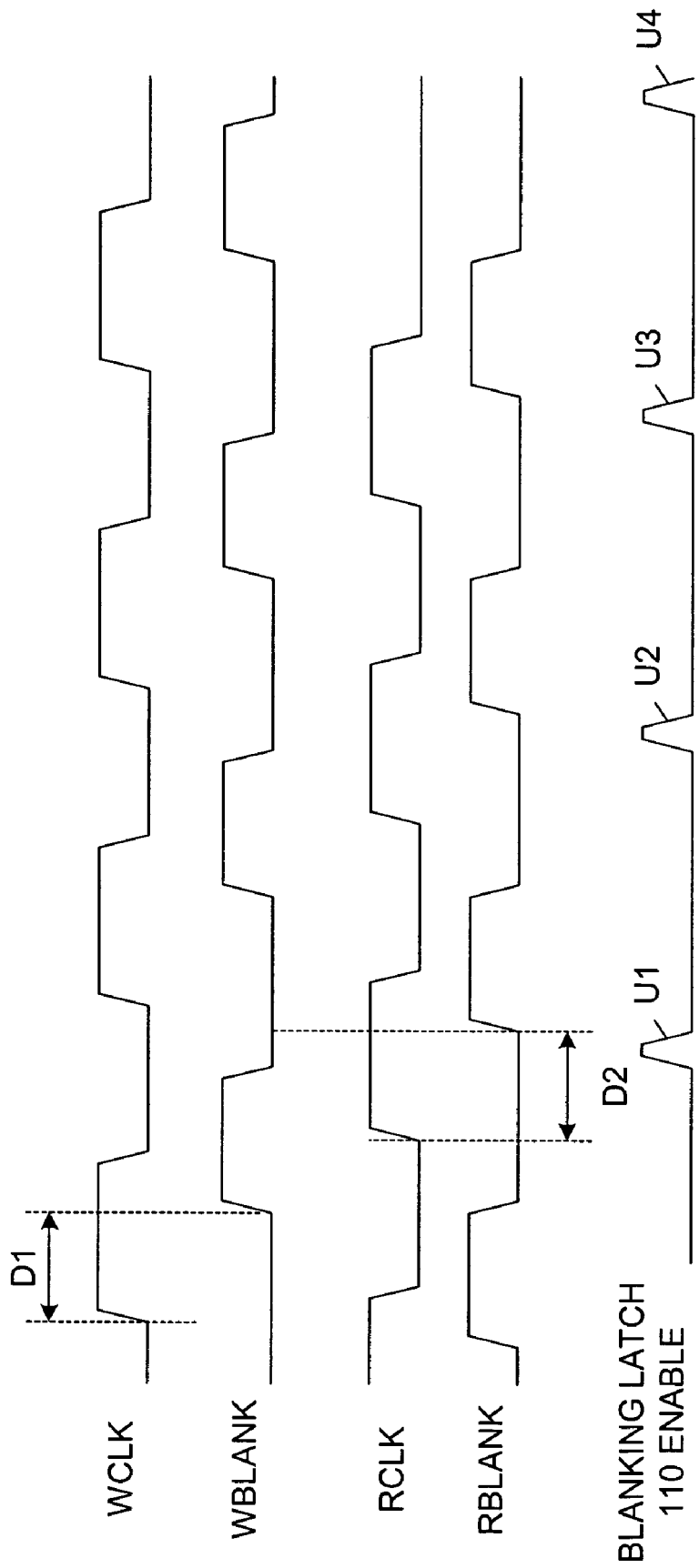
FIG. 1B is a waveform diagram illustrating the operation of the flag generation circuit of FIG. 1A.

Comparator 105 receives the filtered WCNT and RCNT signals from blanking registers 201–202, and in response, generates a flag signal (FLG). Although comparator 105 still introduces noise 115 to the FLG signal, this noise 115 is significantly less than the noise 116 introduced to the FLAG signal in the prior art (FIGS. 1A–1B).

Delay circuit 221 activates the W_C_BLANK signal in response to the W_R_BLANK signal. More specifically, delay circuit 221 detects the rising edge of the W_R_BLANK signal, and after a delay $D_B$, activates the W_C_BLANK signal. The delay $D_B$ is selected to correspond with the signal delay through comparator 105. In one embodiment, the W_C_BLANK signal has a duration of about 28% percent (or less) of the period of the write clock signal WCLK.

Similarly, delay circuit 231 activates the R_C_BLANK signal in response to the R_R_BLANK signal. More specifically, delay circuit 231 detects the rising edge of the R_R_BLANK signal, and after a delay $D_D$, activates the R_C_BLANK signal. The delay $D_D$ is selected to correspond with the signal delay through comparator 105. In one embodiment, the R_C_BLANK signal has a duration of about 28% percent (or less) of the period of the read clock signal RCLK.

The W_C_BLANK and R_C_BLANK signals are each activated for a duration corresponding to the duration of the noise 115 introduced by comparator 105. Because the duration of noise 115 is significantly shorter than the duration of noise 116 (FIG. 1A), the activated duration of the W_C_BLANK and R_C_BLANK signals are significantly shorter than the activated duration of the WBLANK and RBLANK signals (FIGS. 1A–1B).

That is, each of the blanking signals W_R_BLANK, W_C_BLANK, R_R_BLANK and R_C_BLANK used at the input and output terminals of comparator 105 are narrower than a composite blanking signal (e.g., WBLANK or RBLANK) required to blank noise from multiple sources when using a single blanking latch at the output terminal of the comparator. In the present embodiment, the blanking signal from an upstream blanking register initiates the start of a blanking signal for a downstream blanking latch. Thus, the noises are separately filtered in sequential multiple blanking registers and latches. The blanking registers and blanking latches can be in serial and/or parallel configurations depending on the sources of noise and the combinational logic.

Note that blanking registers 201–202 and the associated blanking signals W_R_BLANK and R_R_BLANK at the inputs of comparator 105 do not limit the cycle time of the clock signals WCLK and RCLK. Only blanking latch 110 and the associated blanking signals W_C_BLANK and R_C_BLANK at the output of comparator 105 limit the cycle time of the clock signals WCLK and RCLK.

As shown in FIG. 3, blanking latch 110 is enabled during the relatively long periods represented by pulses L1–L9, thereby allowing the FLG signal provided by comparator 105 to be reliably stored in blanking latch 110 as the output flag signal FLG_OUT. Even in worst case conditions, the overall blanking signal width, which includes both the W_C_BLANK and R_C_BLANK signals, cannot be wider than the period of the WCLK and RCLK signals. Advantageously, flag generation circuit 200 does not provide any erroneous flag states in the multi-queue FIFO memory system. The present embodiment effectively addresses the problems introduced by increased functionality of logic circuits 103–104 in today's more sophisticated multi-queue FIFO devices, which have increased noise sources.

Although the invention has been described in connection with several embodiments, it is understood that this invention is not limited to the embodiments disclosed, but is capable of various modifications, which would be apparent to one of ordinary skill in the art. Thus, although the present invention has been described in terms of a flag generation circuit, it is understood that the principles of the present invention can be used in other applications having multiple noise sources. Also, although there are two filtering circuits in the described embodiments, it is understood that this invention can also be used applications having other numbers of filtering circuits with corresponding numbers of blanking and/or control signals (<28% of period). Thus, the present invention is only intended to be limited by the following claims.

We claim:

1. A noise filtering circuit comprising:
a first signal source configured to provide a first signal that is synchronized with a first clock signal and exhibits a first noise;
a second signal source configured to provide a second signal that is synchronized with a second clock signal and exhibits a second noise, wherein the first and second clock signals are asynchronous;
a first delay circuit configured to generate a first blanking signal in response to the first clock signal, wherein the first blanking signal has a duration corresponding with a duration of the first noise;
a second delay circuit configured to generate a second blanking signal in response to the second clock signal, wherein the second blanking signal has a duration corresponding with a duration of the second noise;
a first storage device configured to store the first signal in response to the first blanking signal, such that the first noise is not present when the first signal is stored;
a second storage device configured to store the second signal in response to the second blanking signal, such that the second noise is not present when the second signal is stored; and
a logic circuit coupled to receive the first and second signals stored in the first and second storage devices, and in response, provide an output signal.

2. The noise filtering circuit of claim 1, wherein the first signal source comprises a write counter and logic associated with the write counter, and the second signal source comprises a read counter and logic associated with the read counter.

3. The noise filtering circuit of claim 1, wherein first and second delay circuits are configured to generate the first and second blanking signals in a self-timed manner with respect to the first and second clock signals, respectively.

4. The noise filtering circuit of claim 1, wherein the logic circuit comprises a comparator.

5. The noise filtering circuit of claim 1, further comprising:
a third delay circuit configured to generate a third blanking signal in response to the first blanking signal, wherein the third blanking signal has a duration corresponding with a duration of noise introduced by the logic circuit in response to the first signal;
a fourth delay circuit configured to generate a fourth blanking signal in response to the second blanking signal, wherein the fourth blanking signal has a duration corresponding with a duration of noise introduced by the logic circuit in response to the second signal; and
a third storage device configured to store the output signal in response to the third and fourth blanking signals, such that the noise introduced by the logic circuit in response to the first and second signal is not present when the output signal is stored in the third storage device.

6. The noise filtering circuit of claim 5, wherein the third and fourth delay circuits are configured to generate the third and fourth blanking signals in a self-timed manner with respect to the first and second blanking signals, respectively.

7. The noise filtering circuit of claim 1, wherein the first signal is a write count value, the second signal is a read count value and the output signal is a flag value representative of a difference between the write count value and the read count value.

8. A method comprising:
providing a first signal from a first signal source to a first storage circuit, wherein the first signal is synchronized with a first clock signal and exhibits a first noise;
providing a second signal from a second signal source to a second storage circuit, wherein the second signal is synchronized with a second clock signal and exhibits a second noise, and wherein the first and second clock signals are asynchronous;
introducing a first delay to the first clock signal to generate a first blanking signal, wherein the first blanking signal has a duration corresponding with a duration of the first noise;
introducing a second delay to the second clock signal to generate a second blanking signal, wherein the second blanking signal has a duration corresponding with a duration of the second noise;
storing the first signal in the first storage device in response to the first blanking signal, wherein the first noise is not present when the first signal is stored;
storing the second signal in the second storage device in response to the second blanking signal, wherein the second noise is not present when the second signal is stored; and
generating an output signal in response to the first and second signals stored in the first and second storage devices.

9. The method of claim 8, wherein the first signal is a write count value, the second signal is a read count value, and the output signal is a flag value.

10. The method of claim 8, further comprising generating the first and second blanking signals in a self-timed manner with respect to the first and second clock signals, respectively.

11. The method of claim 8, wherein the step of generating an output signal comprises comparing the first and second signals in the first and second storage devices.

12. The method of claim 8, wherein the duration of the first blanking signal is about 28% percent of a period of the first clock signal, or less.

13. The method of claim 12, wherein the duration of the second blanking signal is about 28% percent of a period of the second clock signal, or less.

14. The method of claim 8, wherein the output signal exhibits a third noise associated with the first signal stored in the first storage device and the second signal stored in the second storage device, the method further comprising:
generating a third blanking signal in response to the first blanking signal;
generating a fourth blanking signal in response to the second blanking signal; and
storing the output signal in response to the third and fourth blanking signals, such that the third noise is not present when the output signal is stored.

15. The method of claim 14, further comprising generating the third and fourth blanking signals in a self-timed manner with respect to the first and second blanking signals, respectively.

16. The method of claim 14, wherein the duration of the third blanking signal is about 28% percent of a period of the first clock signal, or less.

17. The method of claim 16, wherein the duration of the fourth blanking signal is about 28% percent of a period of the second clock signal, or less.

* * * * *